United States Patent [19]
Izawa

[11] Patent Number: 5,272,449
[45] Date of Patent: Dec. 21, 1993

[54] VERTICAL AMPLIFIER SYSTEM FOR MULTITRACE OSCILLOSCOPE AND METHOD FOR CALIBRATING THE SAME

[75] Inventor: Masao Izawa, Kawasaki, Japan

[73] Assignee: Kikusui Electronics Corporation, Kanagawa, Japan

[21] Appl. No.: 26,081

[22] Filed: Mar. 4, 1993

Related U.S. Application Data

[63] Continuation of Ser. No. 816,579, Jan. 3, 1992, abandoned.

[30] Foreign Application Priority Data

Jan. 9, 1991 [JP] Japan .................................. 3-001102
Dec. 19, 1991 [JP] Japan .................................. 3-337170

[51] Int. Cl.⁵ ........................... H03G 3/20; H03F 1/02
[52] U.S. Cl. .......................................... 330/2; 330/9; 330/131
[58] Field of Search ................. 324/76 R, 121 R, 130, 324/97, 123 R; 330/2, 9, 129, 124 R, 131

[56] References Cited

U.S. PATENT DOCUMENTS

3,656,053 4/1972 Richman .................... 324/121 R X
4,415,927 11/1983 Penney ....................... 324/76 R X
4,553,091 11/1985 Bristol .
4,794,343 12/1988 Yang ......................................... 330/2

Primary Examiner—Steven Mottola
Attorney, Agent, or Firm—Finnegan, Henderson, Farabow, Garrett & Dunner

[57] ABSTRACT

A vertical amplifier system for a multitrace oscilloscope including a first and a second variable gain amplifiers each connected to each channel of a multitrace oscilloscope. First, a first reference voltage is fed to the two variable gain amplifiers at the same time. The polarity of output of the second variable gain amplifier is inverted, and the inverted output is added to the output of the first variable gain amplifier by an adder. The added result is detected by a resistor. A CPU automatically controls a gain of at least one of the variable gain amplifiers while receiving the added result so that the added result becomes zero. Second, a second reference voltage (a ground level voltage, for example) is applied to both variable gain amplifiers, and an offset of at least one of the variable gain amplifiers is adjusted so that the added result detected by the resistor becomes zero. The input-output characteristics of both variable gain amplifiers are equalized with high accuracy.

8 Claims, 6 Drawing Sheets

VERTICAL AMPLIFIER SYSTEM FOR MULTITRACE OSCILLOSCOPE AND METHOD FOR CALIBRATING THE SAME

This application is a continuation, of application Ser. No. 07/816,579, filed Jan. 3, 1992, now abandoned.

BACKGROUND OF THE INVENTION

1. Field of the Invention

The present invention relates to a vertical amplifier system for a multitrace oscilloscope and method for calibrating the same that can equalize an input-output characteristic of each variable gain vertical amplifier of each channel.

2. Description of the Related Art

Variable gain amplifiers provided as vertical amplifiers in respective input circuits of a multitrace oscilloscope are adjusted so as to equalize their input-output characteristics. In other words, they are adjusted so that an identical input signal applied to any one of the channels is displayed in just the same form. This adjustment is generally carried out before delivery or at the time of maintenance.

Figure 1:
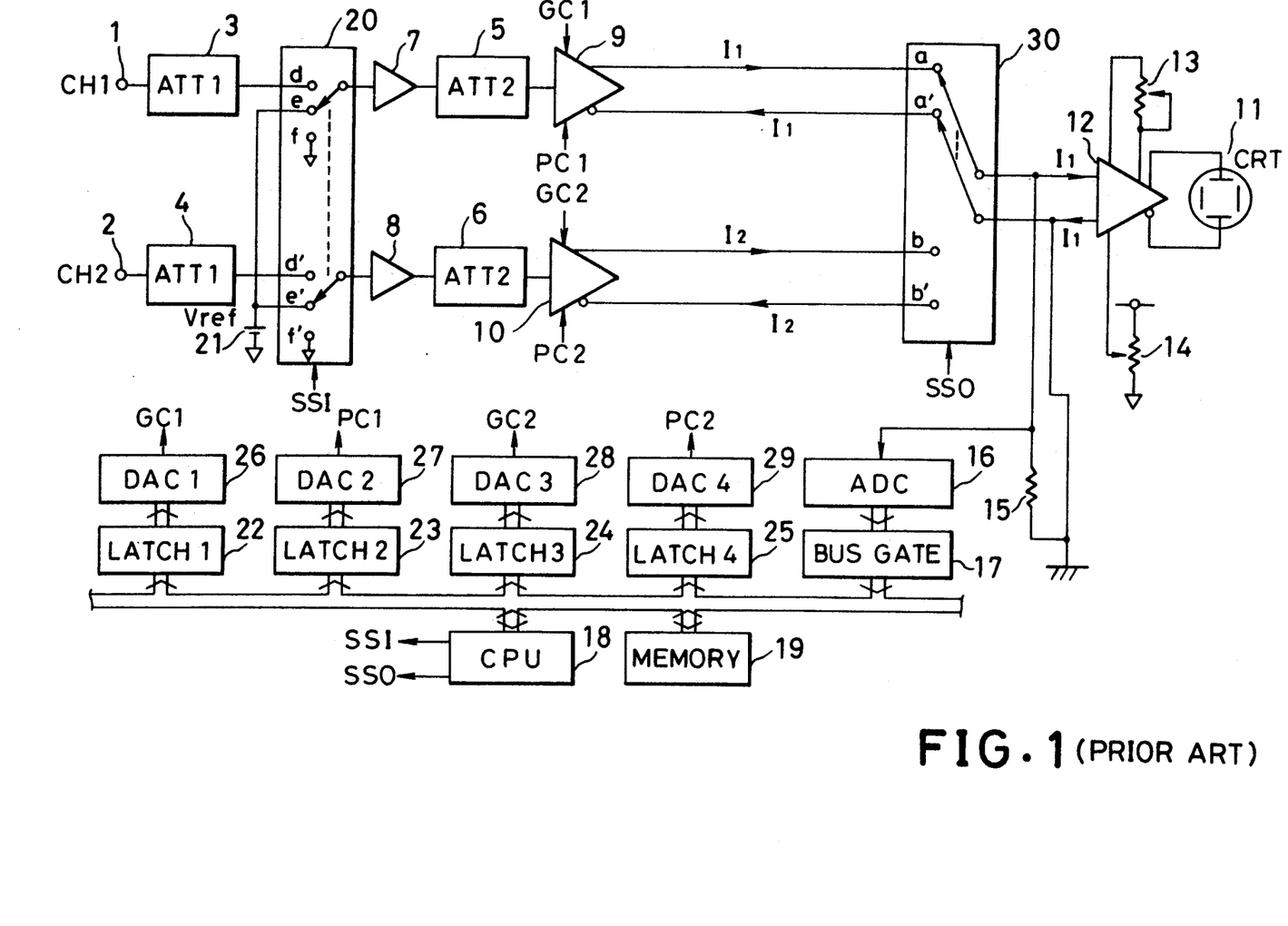
FIG. 1 is a block diagram showing an arrangement of a conventional vertical amplifier system and a calibration circuit thereof.

FIG. 1 is a block diagram showing an arrangement of a conventional calibration circuit for a vertical amplifier system. In FIG. 1, reference numeral 1 designates a signal input terminal of a channel 1 (hereinafter referred to as CH1); 2, a signal input terminal of a channel 2 (hereinafter referred to as CH2); from 3 to 6, variable attenuators; 7 and 8, buffer amplifiers; 9 and 10, variable gain amplifiers each of which outputs an output current in proportion to an input voltage; 30, a multiplexer which selects a signal to be displayed on a cathode ray tube (hereinafter referred to as CRT) 11 in response to a selection signal SSO; 12, an amplifier to drive the CRT 11; 13, a gain adjustor for the amplifier 12; 14, an output offset adjustor for the amplifier 12; 15, a resistor to detect an input current fed to the amplifier 12; and 16, an analog-to-digital converter which converts the detected current to a digital signal. The output digital signal of the analog-to-digital converter 16 is transferred to a CPU 18 through a bus gate 17. Reference numeral 19 denotes a memory to store data; 20, an input signal selector which selects a signal supplied to each variable gain amplifier 9 or 10 in response to a selection signal SSI; 21, a reference voltage generator which generates a first reference voltage Vref to calibrate the variable gain amplifiers 9 and 10; 22-25, latches; and 26-29, digital-to-analog converters. The CPU 18 feeds gain control signals GC1 and GC2, or position (offset) control signals PC1 and PC2 to the variable gain amplifiers 9 and 10 via the latches 22-25 and the digital-to-analog converters 26-29. Here, the gain control signals GC1 and GC2 are for controlling the gains of the variable gain amplifiers 9 and 10, and the position control signals PC1 and PC2 are for adjusting the offsets of the output currents of the variable gain amplifiers 9 and 10.

The conventional circuit arranged as in FIG. 1 operates differently in a normal mode where input signals are displayed and in a calibration mode where the gains and offsets of the variable gain amplifiers are adjusted. In the normal mode, the CPU 18 controls the input signal selector 20 to select its terminals d and d' by using the selection signal SSI. Thus, signals inputted to the terminals 1 and 2 to be measured, are fed to the variable gain amplifiers 9 and 10. In addition, the CPU 18 controls the multiplexer 30 so that the multiplexer 30 alternately selects its terminals a and a', and b and b' in response to the selection signal SSO, thus, displaying the signals to be measured on the CRT 11.

The operation of the calibration mode of the vertical amplifier system comprising the variable gain amplifiers 9 and 10 is as follows:

When the variable gain amplifiers 9 and 10 are calibrated, the CPU 18 controls the input signal selector 20 to select its terminals e and e' by using the selection signal SSI. The variable attenuators 5 and 6 are set at a certain fixed attenuation ratio. In this condition, the first reference voltage Vref is supplied to the variable gain amplifiers 9 and 10.

In the calibration mode of the variable gain amplifier 9, the CPU 18 controls the multiplexer 30 to select its terminals a and a' at first by using the selection signal SSO in order to detect the output current I1 of the variable gain amplifier 9. Then, as shown in FIG. 2, the inclination of the input-output characteristic line is adjusted by using the gain control signal GC1 so that the output current I1 becomes a predetermined current I0.

Next, the CPU 18 controls the input signal selector 20 to select its terminals f and f' by using the selection signal SSI so that a ground signal (0 V) is supplied to the variable gain amplifier 9 as a second reference voltage for an offset adjustment. Subsequently, as shown in FIG. 2, a position (offset) $I_f$ of the input-output characteristic line is adjusted by the position control signal PC1 so that the value of output current I1 becomes zero.

Figure 2:
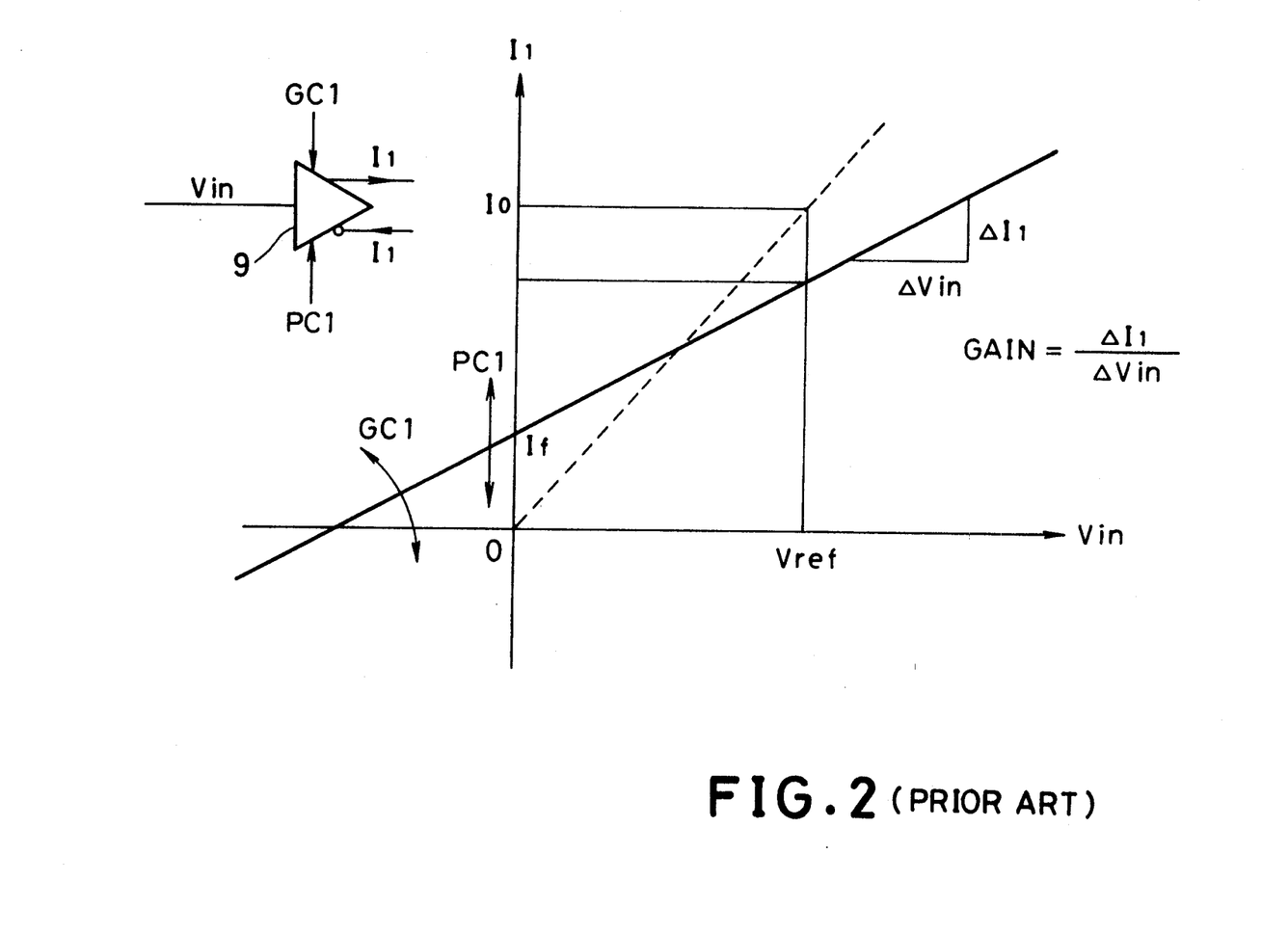
FIG. 2 is a graph to explain adjustment of a variable gain amplifier 9.

As clearly shown in FIG. 2, when the gain of the variable gain amplifier 9 is changed so that the output current of the variable gain amplifier 9 becomes I0 when the input voltage is Vref, the output current (offset) $I_f$ corresponding to the second reference voltage (0 V) is also changed. Reversely, when the position (offset) $I_f$ is changed when the second reference voltage is inputted, the output current corresponding to the input voltage Vref is also changed. Accordingly, the CPU 18 must repeat alternately adjusting the gain and the position (offset) until the input-output characteristic line accords with the characteristic line indicated by a broken line in FIG. 2. At this stage, the calibration of the variable gain amplifier 9 is completed.

Subsequently, the CPU 18 controls the multiplexer 30 to select its terminals b and b' by using the selection signal SSO, thus calibrating the variable gain amplifier 10 by the same method as used for calibrating the variable gain amplifier 9.

Thus, both variable gain amplifiers 9 and 10 have the same input-output characteristic as shown by the broken line of FIG. 2 after calibration.

Here, an operator manipulates a switch connected to the CPU 18 so that the multiplexer 30 selects one of two outputs of the variable gain amplifiers 9 and 10, and the selected output is fed to the amplifier 12 to drive the CRT 11. Subsequently, the operator manipulates a switch connected to the CPU 18 so that the input selector 20 selects the ground signal (0 V) (the second reference voltage), and adjusts the output offset with adjustor 14 while observing a screen so that the signal is displayed at a first intended position of the screen of the CRT 11. Next, the operator manipulates the switch connected the CPU 18 so that the input selector selects the first reference voltage Vref, and adjusts the gain adjustor 13 so that the signal is displayed at a second intended position on the screen. Finally, the operator repeats the foregoing adjustment until the ground signal (the second reference voltage) and the first reference voltage Vref are correctly displayed at the first and second intended positions, respectively.

Thus, a gain and an output offset of the variable gain amplifiers in a whole vertical amplifier system are finally decided so that the input signal is displayed correctly with matching the characteristics of an individual CRT by manipulating the gain adjustor 13 and the output offset adjuster 14.

Incidentally, accuracy of calibrating the variable gain amplifiers 9 and 10 is determined by the resolution of the analog-to-digital converter 16. If a tolerance determined by the resolution of the analog-to-digital converter is $\pm\epsilon$, the input-output characteristics of both variable gain amplifiers 9 and 10 may include errors within the range shown in FIG. 3 in the foregoing conventional circuit. That is, the output offsets and the gains of the two variable gain amplifiers may include difference up to $2\epsilon$ and $4\epsilon/Vref$, respectively.

Furthermore, in the foregoing conventional circuit, there is a problem that both input-output characteristics of the variable gain amplifiers 9 and 10 do not match each other even after the adjustment, when the output voltage of the reference voltage generator 21 is changed during the calibration interval of the variable gain amplifiers 9 and 10. In other words, waveforms on the screen of CRT 11 may be different even when an identical signal is inputted to each channel after adjustment.

SUMMARY OF THE INVENTION

Accordingly, it is an object of the present invention to provide a vertical amplifier system for a multitrace oscilloscope and method for calibrating the same that can equalize input-output characteristics of variable gain amplifiers with high accuracy even if the output voltage of a reference voltage generator varies.

In a first aspect of the present invention, there is provided a vertical amplifier system for a multitrace oscilloscope comprising:

a first variable gain amplifier amplifying, as a first vertical amplifier, an input signal applied to a first channel;

a second variable gain amplifier amplifying, as a second vertical amplifier, an input signal applied to a second channel;

inversion means connected to an output of the second variable gain amplifier for inverting the output of the second variable gain amplifier;

adding means for adding an output of the inversion means and an output of the first variable gain amplifier;

detection means for detecting an output of the adding means;

first reference voltage generating means for generating a first reference voltage;

second reference voltage generating means for generating a second reference voltage which is different from the first reference voltage;

selecting means for selectively applying the first reference voltage or the second reference voltage to the first and second variable gain amplifiers at the same time;

gain control means for controlling a gain of at least one of the first and second variable gain amplifiers so that the output of the detection means becomes zero while the first reference voltage is supplied to both the first and second variable gain amplifiers; and offset control means for controlling an offset of at least one of the first and second variable gain amplifiers so that the output of the detection means becomes zero while the second reference voltage is supplied to both the first and second variable gain amplifiers.

Here, the second reference voltage generating means may be a switch circuit for supplying a ground signal to input terminals of the first and second variable gain amplifiers.

The inversion means may be a transfer switch which is connected to the output of the second variable gain amplifier.

In a second aspect of the present invention, there is provided a vertical amplifier system for a multitrace oscilloscope comprising:

a first variable gain amplifier amplifying, as a first vertical amplifier, an input signal applied to a first channel;

a second variable gain amplifier amplifying, as a second vertical amplifier, an input signal applied to a second channel;

adding means for adding a first input and a second input, the first input being an output of the first variable gain amplifier;

detection means for detecting an output of the adding means;

first reference voltage generating means for generating a first reference voltage;

second reference voltage generating means for generating a second reference voltage which is different from the second reference voltage;

an inverter inverting the first reference voltage;

inversion means connected to an output of the second variable gain amplifier for inverting the output of the second variable gain amplifier, and supplies its output to the adder as the second input;

selecting means for selectively applying the first reference voltage to the first variable gain amplifier and an output of the inverter to the second variable gain amplifier at the same time, or the second reference voltage to the first and second variable gain amplifiers at the same time;

gain control means for controlling a gain of at least one of the first and second variable gain amplifiers so that an output of the detection means becomes zero while the first reference voltage is supplied to the first variable gain amplifier, and the output of the inverter is applied to the second variable gain amplifier; and offset control means for controlling an offset of at least one of the first and the second variable gain amplifiers so that the output of the detection means becomes zero while the second reference voltage is applied to both the first and second variable gain amplifiers, and the output of the second variable gain amplifier which is inverted by the inversion means is applied to the adding means as the second input.

The inversion means may be a transfer switch which is connected to the output of the second variable gain amplifier.

In a third aspect of the present invention, there is provided a calibration method for vertical amplifier system for a multitrace oscilloscope, the vertical amplifier system including a first variable gain amplifier and a second variable gain amplifier, the calibration method comprising the steps of:

applying a first reference voltage to the first and second variable gain amplifier at the same time;

inverting an output of the second variable gain amplifier, and outputs an inverted output of the second variable gain amplifier;

adding an output of the first variable gain amplifier to the inverted output of the second variable gain amplifier, and outputs an added result;

adjusting a gain of at least one of the first and second variable gain amplifiers so that the added result becomes zero;

applying a second reference voltage to the first and second variable gain amplifier at the same time;

inverting an output of the second variable gain amplifier, and outputs an inverted output of the second variable gain amplifier;

adding an output of the first variable gain amplifier to the inverted output of the second variable gain amplifier, and outputs an added result; and adjusting an offset of at least one of the first and second variable gain amplifiers so that the added result becomes zero.

The calibration method for vertical amplifier system for a multitrace oscilloscope may further comprises the step of repeating the steps of adjusting a gain and adjusting an offset alternately.

The second reference voltage may be a ground voltage.

In the present invention, the output voltage of the first reference voltage generating means is fed to the first and the second variable gain amplifiers at the same time. The polarity of the output of the second variable amplifier is inverted by the inversion means. In this way, two outputs of opposite polarities are added by the adding means, and the added result is detected by the detection means. The gain control means controls the gain of at least one of the two variable gain amplifiers so that the output of the detection means becomes zero.

Next, the output voltage of the second reference voltage generating means is supplied to the first and the second variable gain amplifiers at the same time. The polarity of the output of the second variable amplifier is inverted by the inversion means. In this way, two outputs of opposite polarities are added by the adding means, and the added result is detected by the detection means. The offset control means automatically controls an offset of at least one of the two variable gain amplifiers so that the output of the detection means becomes zero. By repeating the foregoing procedure, the gains and the offsets of both variable gain amplifiers agree, and as a result, the input-output characteristics of both variable gain amplifiers accord with each other.

The above and other objects, effects, features and advantages of the present invention will become more apparent from the following description of embodiments thereof taken in conjunction with the accompanying drawings.

DETAILED DESCRIPTION OF PREFERRED EMBODIMENT

The invention will now be described with reference to the accompanying drawings.

EMBODIMENT 1

Figure 4:
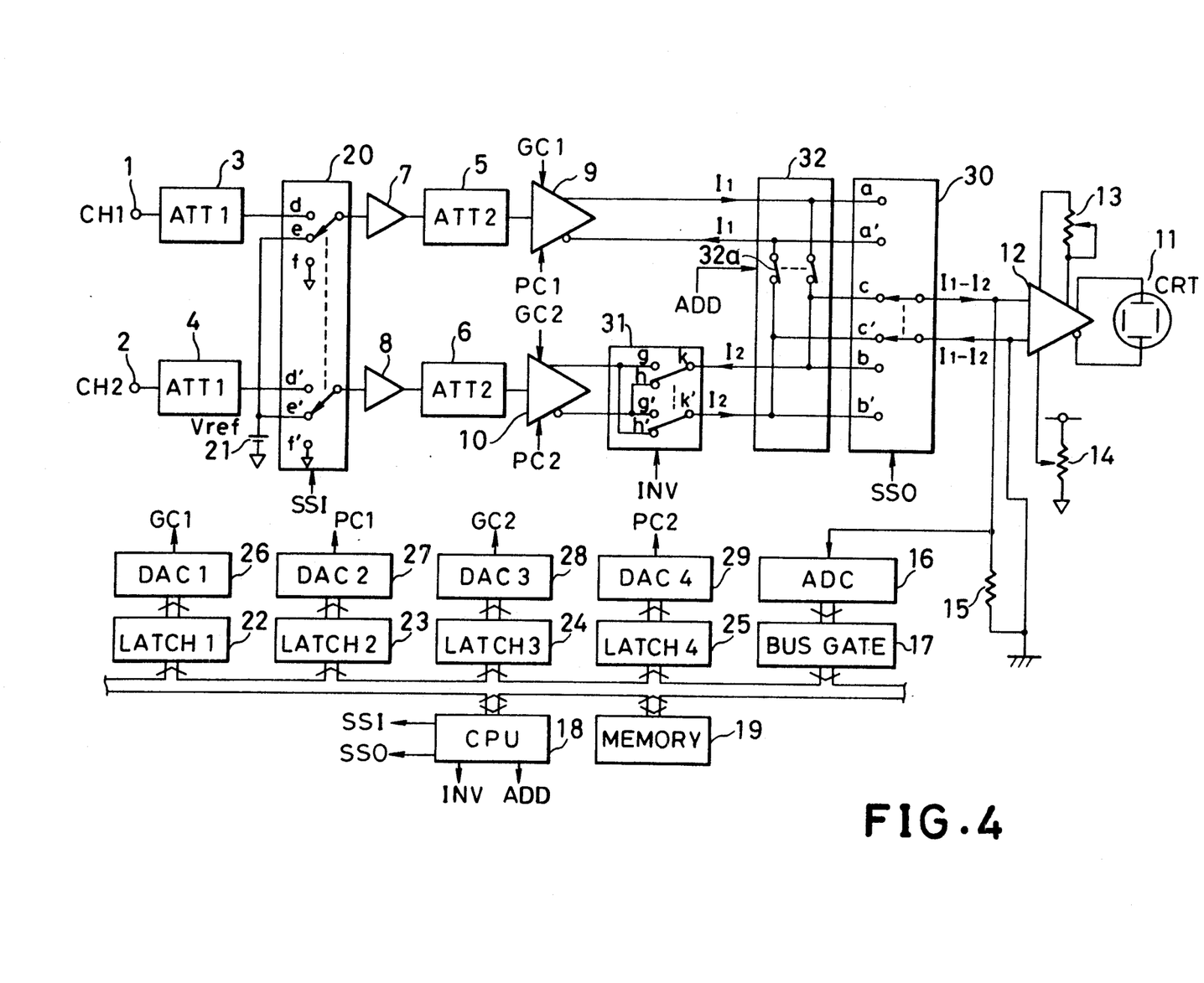
FIG. 4 is a block diagram showing an arrangement of a first embodiment of a vertical amplifier system according to the present invention.

FIG. 4 is a block diagram showing an arrangement of a first embodiment of the present invention.

The corresponding parts in FIGS. 1 and 4 are designated by the same reference numerals.

In FIG. 4, reference numeral 31 denotes a transfer switch to invert an output polarity of a variable gain amplifier 10. Normally, the switch 31 connects g-k and g'-k', whereas it connects h-k and h'-k' when receiving the inversion signal INV from a CPU 18. Reference numeral 32 denotes an adder to add output currents I1 and I2 of respective variable gain amplifiers 9 and 10. The adder 32 feeds the added current to an amplifier 12 through terminals c and c' of a multiplexer 30 when the CPU 18 feeds an adding signal ADD.

In a normal mode, the CPU 18 in FIG. 4 controls an input signal selector 20 to select its terminals d and d', the transfer switch 31 to select the terminals g and g', and a switch 32a in the adder 32 to open. Furthermore, the CPU 18 controls the multiplexer 30 to select its terminals a and a', and then its terminals b and b' by using the selection signal SSO, thereby displaying signals inputted to terminals 1 and 2 on the CRT 11.

In this state, when an operator manipulates an INVT switch connected to the CPU 18 so that the CPU outputs the inversion signal INV, the transfer switch 31 is connected to the terminal h and h', and then the signal inputted to the input terminal 2 is displayed in reversed form on the CRT 11. Furthermore, when the operator manipulates an ADD switch connected to the CPU 18 so that the CPU 18 outputs the adding signal ADD and the selection signal SSO, the switch 32a in the adder 32 closes, and the multiplexer 30 selects its terminals c and c' in response to these signals so that a subtraction signal of the signals inputted from the input terminals 1 and 2 is displayed on CRT 11.

In a calibration mode where the variable gain amplifiers 9 and 10 are calibrated, the CPU 18 proceeds process in accordance with the procedure stored in a memory 19.

Figure 5:
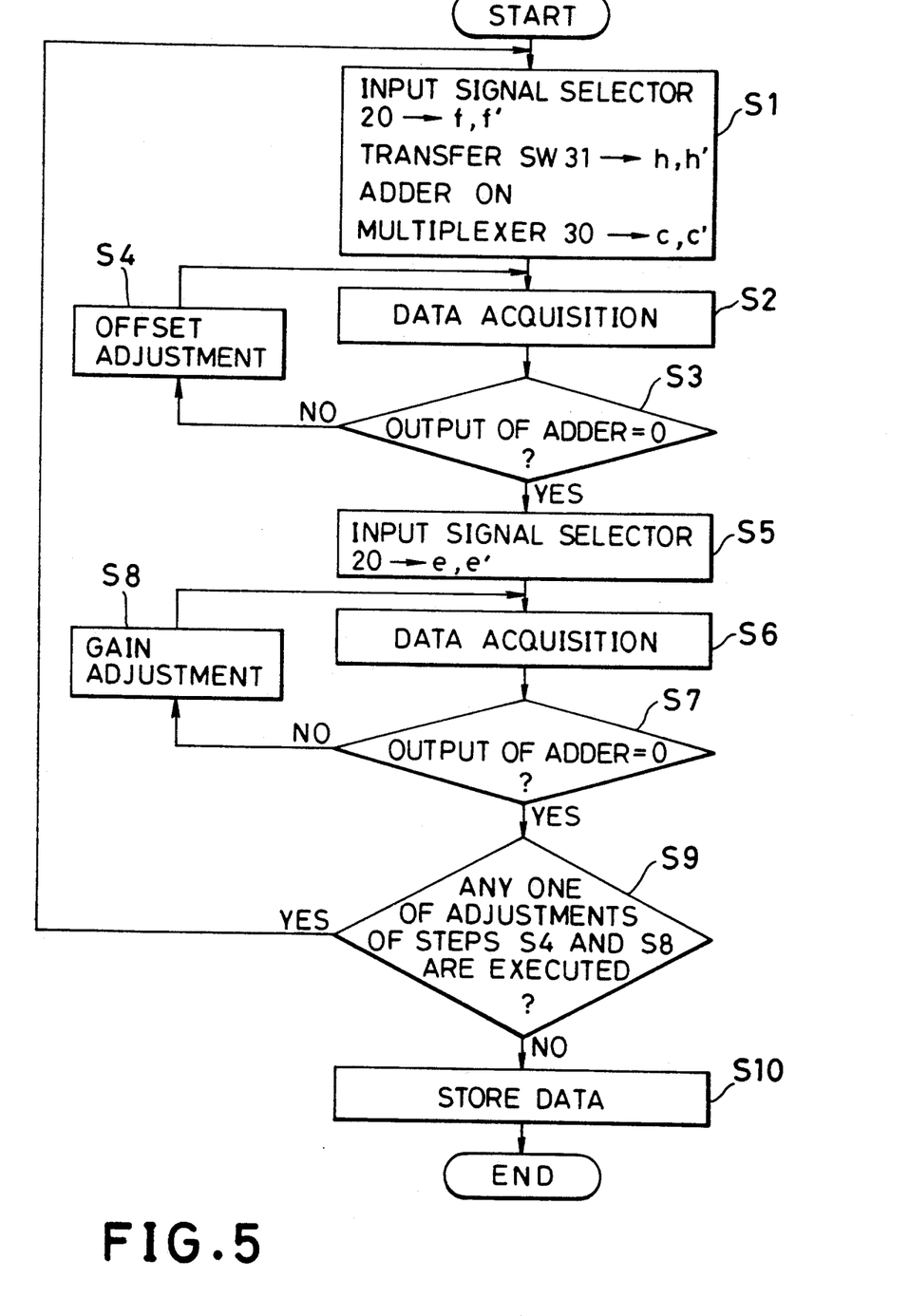
FIG. 5 is a flowchart illustrating an example of the procedure of the CPU of FIG. 4.

FIG. 5 is a flowchart illustrating an example of the procedure of the CPU 18 in the calibration mode of the variable gain amplifiers. This calibration process is carried out to equalize the input-output characteristics of both variable gain amplifiers 9 and 10, and the outline of the process is as follows: Both outputs of variable gain amplifiers 9 and 10 are made equal by using the position (offset) control signal when a second reference voltage is supplied to both variable gain amplifiers 9 and 10. Subsequently, both outputs are made equal by using the gain control signal when a first reference voltage is supplied to both variable gain amplifiers 9 and 10. Incidentally, before the process, attenuation ratios of the variable attenuators 5 and 6 must be set at a fixed value.

Detailed processing of the calibration mode is described with reference to FIG. 5.

At step S1, the CPU 18 controls the input signal selector 20 to select its terminals f and f' so that a second reference voltage (0 V) is applied to the variable amplifiers 9 and 10 via buffer amplifiers 7 and 8 and attenuators 5 and 6 by using the selection signal SSI. The CPU further controls the transfer switch 31 to connect its terminals h and h' with the terminals k and k', respectively, by using the inversion signal INV, closes the switch 32a in the adder 32 by using the adding signal ADD, and controls the multiplexer 30 to select its terminals c and c' by using the selection signal SSO.

In this state, the second reference voltage, that is, the ground signal of 0 V, is fed to both variable gain amplifiers 9 and 10 for adjusting the difference between both offsets, and the difference (I1-I2) between the output currents of the variable gain amplifiers 9 and 10 is detected by a resistor 15.

At step S2, the CPU 18 receives the output (I1-I2) of the adder 32, which is detected by the resistor 15, via an analog-to-digital converter 16 and a bus gate 17.

At step S3, the output of the adder 32 is judged whether the output is zero or not. When it is not zero, the processing proceeds to step S4.

At step S4, the CPU 18 increments the position control signal PC1 or PC2 by a fixed amount. Subsequently, the CPU 18 returns to step S2 where it receives the output of the adder 32, and tests whether the output is zero or not at step S3. When the output is not zero, the CPU 18 proceeds to step S4 again. At step S4, the CPU 18 compares the previous output value of the adder 32 with the current output value. When the current output value is closer to zero than the previous output value, the CPU 18 increments the position control signal PC1 or PC2 by the fixed value again. In contrast, when the previous output value is closer to zero than the current output value, the CPU 18 decrements the position control signal PC1 or PC2 by the fixed value. By repeating this procedure, the position (offset) $I_f$ of the input-output characteristic of the variable gain amplifiers 9 or 10 is adjusted.

The processing steps S2-S4 are repeated until the judgement at step S3 becomes positive. When it becomes positive, the processing proceeds to step S5.

At step S5, the CPU 18 controls the input signal selector 20 to select its terminals e and e' so that the first reference voltage Vref is applied to the variable gain amplifiers 9 and 10 by using the selection signal SSI.

At step S6, the CPU 18 receives the difference (I1-I2) between the output currents of the variable gain amplifiers 9 and 10 detected by the resistor 15.

At step S7, the output current difference (I1-I2), that is, the output of the adder 32 is judged whether it is zero or not. When it is not zero, the processing proceeds to step S8.

At step S8, the CPU 18 increments the gain control signal GC1 or GC2 by a fixed amount. Subsequently, the CPU 18 returns to step S6 where it receives the output of the adder 32, and tests whether the output is zero or not at step S7. When the output is not zero, the CPU 18 proceeds to step S8 again. At step S8, the CPU 18 compares the previous output value of the adder 32 with the current output value. When the current output value is closer to zero than the previous output value, the CPU 18 increments the gain control signal GC1 or GC2 by the fixed value again. In contrast, when the previous output value is closer to zero than the current output value, the CPU 18 decrements the gain control signal GC1 or GC2 by the fixed value. By repeating this procedure, the gain (the slope) of the input-output characteristic of the variable gain amplifiers 9 (or 10) is adjusted by using the gain control signal GC1 (or GC2).

The processing in the foregoing steps S6-S8 is repeated until the judgment at step S7 becomes positive. When it becomes positive, the processing proceeds to step S9.

As mentioned before, the variable gain amplifier has characteristics that the position (offset) corresponding to 0 V input is shifted by changing the gain, and the output corresponding to the Vref input is shifted by changing the position (offset). Therefore, it is judged in step S9 whether either adjustments of the position (offset) in step S4 or the gain in step S8 is executed or not. When executed, the processing in the steps S1-S9 is repeated. When it is judged in step S9 that the position (offset) and the gain are not adjusted, the processing proceeds to step S10. At step 10, the values of the control signals GC1, PC1, GC2 and PC2, which are outputted to the variable gain amplifiers 9 and 10, are stored in the memory 19.

Figure 3:
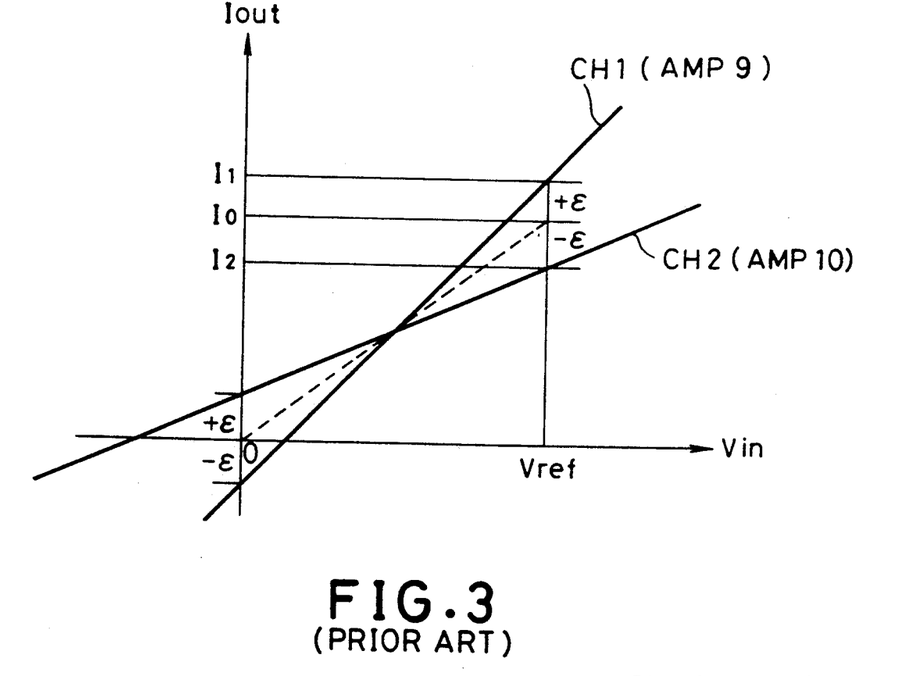
FIG. 3 is a graph illustrating input-output characteristics indicating accuracy of the conventional vertical amplifier system.
Figure 6:
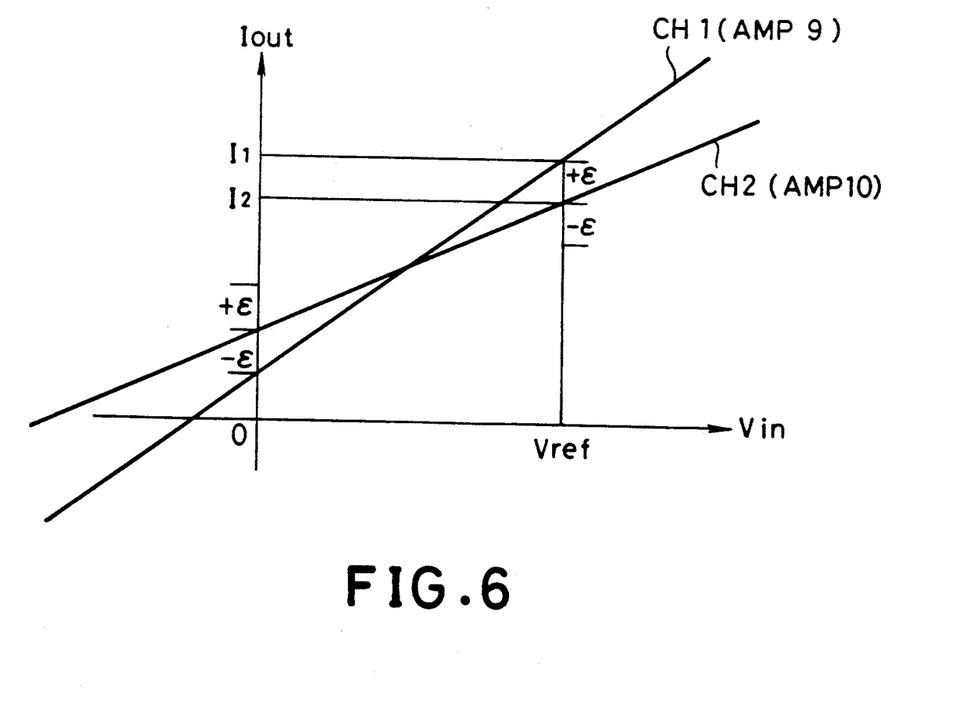
FIG. 6 is a graph illustrating input-output characteristics indicating accuracy of the first embodiment of FIG. 4.

When the variable gain amplifiers 9 and 10 are equalized by adjusting one of the variable gain amplifiers 9 or 10 by the foregoing processing, a maximum error of the input-output characteristics of both variable gain amplifiers becomes as shown in FIG. 6. Here, $\pm \epsilon$ is a tolerance determined by the resolution of the analog-to-digital converter 16. As shown in FIG. 6, in the present embodiment, a maximum error of the output offset corresponding to the ground signal and that of the gain are $\epsilon$ and $2\epsilon/Vref$, respectively. This is because, in this embodiment, the input-output characteristic of the variable gain amplifiers 9 (or 10) is used as a reference, and that of the variable gain amplifier 10 (or 9) is adjusted so as to agree with the reference. As a result, the present embodiment can reduce the error to half comparing with that of the conventional circuit as shown in FIG. 3.

After the calibration of the variable gain amplifiers 9 and 10 is finished, an operator finally determines the gain and the output offset in the whole vertical amplifier system by adjusting an output offset adjustor 14 and a gain adjustor 13 while observing the screen of CRT 11 as in the conventional method. Since the final gain and the output offset are determined by the operator using the foregoing way, an error in the position on the display due to the offset current of the variable gain amplifiers can be eliminated even if the offset current corresponding to the ground signal (0 V) is not zero. In this way, an identical voltage supplied to the variable gain amplifiers 9 and 10 will be displayed in just the same form because the present embodiment can equalize the input-output characteristics of both variable gain amplifiers 9 and 10 with high accuracy even if the output voltage of the reference voltage generator 12 changes during the gain adjustment.

Although the present embodiment is described exemplifying a 2-channel oscilloscope, in a 4-channel oscilloscope, for example, the positions (offsets) and the gains of the input-output characteristics of all variable gain amplifiers can be matched with high accuracy by adjusting the positions (offset) and the gains of three variable gain amplifiers to the other variable gain amplifier which has the function of the output inversion, and serves as the reference. Furthermore, when the variable gain amplifiers of the 4-channel oscilloscope are calibrated, the present embodiment can equalize the gains of all amplifiers by the three calibration processes although the conventional method requires one calibration for each amplifiers, that is, four calibration processes.

EMBODIMENT 2

Figure 7:
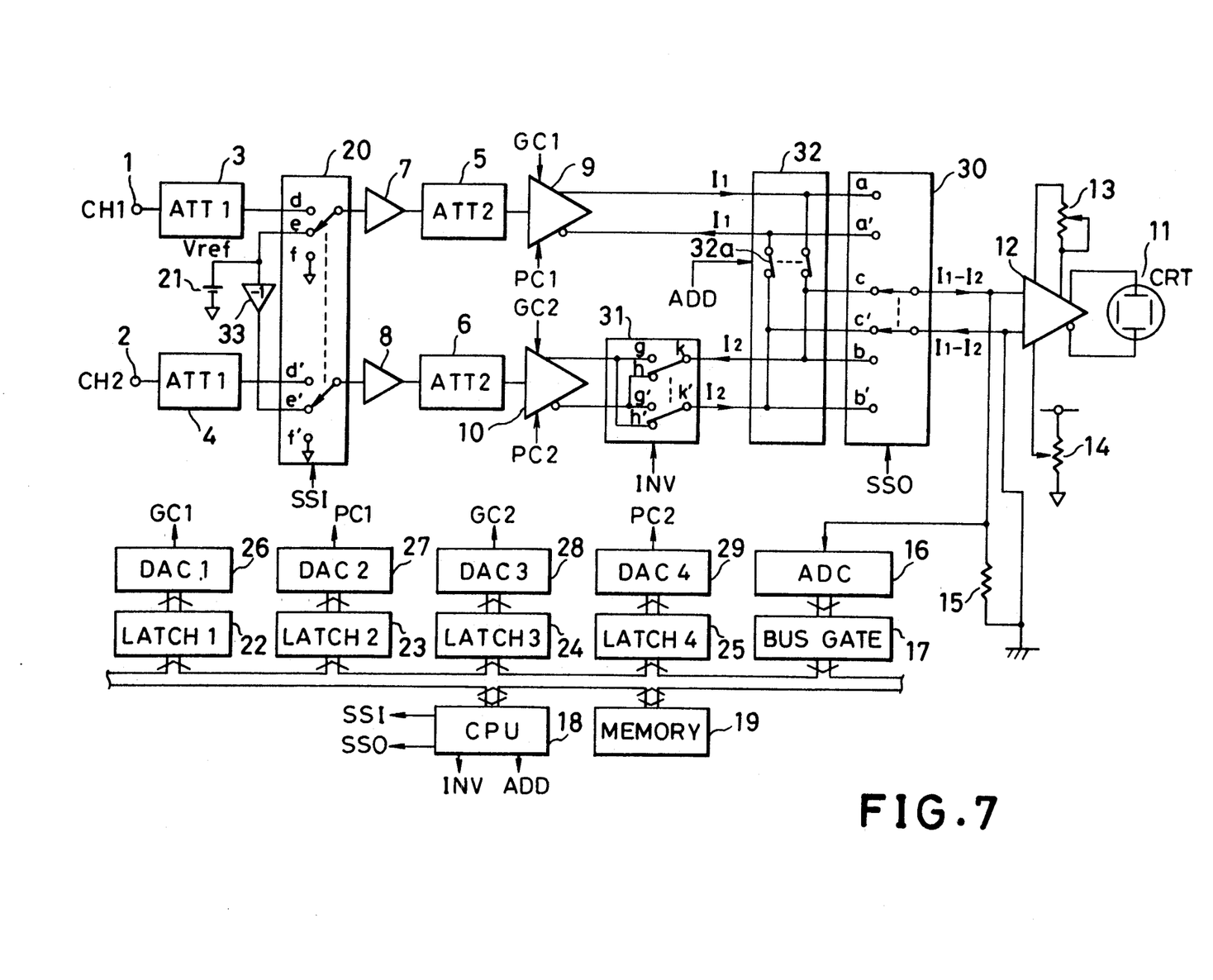
FIG. 7 is a block diagram showing an arrangement of a second embodiment of a vertical amplifier system according to the present invention.

FIG. 7 is a block diagram showing an arrangement of a second embodiment of the present invention. The corresponding parts shown in FIG. 4 are designated by the same reference numerals. Reference numeral 33 denotes an inversion amplifier whose gain is −1.

In this embodiment, the output voltages of variable gain amplifiers 9 and 10 have opposite polarities because a first reference voltage Vref produced by a reference voltage generator 21 is inverted by the inversion amplifier 33 before it is supplied to the variable gain amplifier 10. Thus, the output of the variable gain amplifier 10, which has the opposite polarity to that of the variable gain amplifier 9, is added to the output of the variable gain amplifier 9.

The operation of the second embodiment differs from that of the first embodiment shown in FIG. 4 in that the transfer switch 31 is not inverted before the gain adjustment of step S8 of the flowchart of FIG. 5, and hence, the transfer switch 31 is returned to its terminals g-k and g'-k'. The other arrangement and operation are the same as those of the embodiment shown in FIG. 4, and so, their description is omitted.

As explained in the foregoing description, the polarity of the output of the variable gain amplifier used as a reference amplifier can be inverted either at the input side or at the output side of the variable gain amplifier when the first reference voltage Vref is supplied.

Thus, the input-output characteristics of both variable gain amplifiers can be made equal with high accuracy because the input-output characteristics are adjusted by supplying an identical voltage to both variable gain amplifiers at the same time.

The present invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A vertical amplifier system for a multitrace oscilloscope comprising:
   a first variable gain amplifier amplifying, as a first vertical amplifier, an input signal applied to a first channel;
   a second variable gain amplifier amplifying, as a second vertical amplifier, an input signal applied to a second channel;
   inversion means connected to an output of said second variable gain amplifier for inverting the output of said second variable gain amplifier;
   adding means for adding an output of said inversion means and an output of said first variable gain amplifier;
   detection means for detecting an output of said adding means;
   first reference voltage generating means for generating a first reference voltage;
   second reference voltage generating means for generating a second reference voltage which is different from said first reference voltage;
   selecting means for selectively applying the first reference voltage or the second reference voltage to said first and second variable gain amplifiers at the same time;
   gain control means for controlling a gain of at least one of said first and said second variable gain amplifiers so that the output of said detection means becomes zero while said first reference voltage is supplied to both said first and second variable gain amplifiers; and
   offset control means for controlling an offset of at least one of said first and second variable gain amplifiers so that the output of said detection means becomes zero while said second reference voltage is supplied to both said first and second variable gain amplifiers.

2. The vertical amplifier system for a multitrace oscilloscope as claimed in claim 1, wherein said second reference voltage generating means is a switch circuit for supplying a ground signal to input terminals of said first and second variable gain amplifiers.

3. The vertical amplifier system for a multitrace oscilloscope as claimed in claim 1, wherein said inversion means is a transfer switch which is connected to the output of said second variable gain amplifier.

4. A vertical amplifier system for a multitrace oscilloscope comprising:
   a first variable gain amplifier amplifying, as a first vertical amplifier, an input signal applied to a first channel;
   a second variable gain amplifier amplifying, as a second vertical amplifier, an input signal applied to a second channel;
   adding means for adding a first input and a second input, said first input being an output of said first variable gain amplifier;
   detection means for detecting an output of said adding means;
   first reference voltage generating means for generating a first reference voltage;
   second reference voltage generating means for generating a second reference voltage which is different from said first reference voltage;
   an inverter inverting the first reference voltage;
   inversion means connected to an output of said second variable gain amplifier for inverting the output of said second variable gain amplifier, and supplies its output to said adder as the second input;
   selecting means for selectively applying the first reference voltage to said first variable gain amplifier and an output of said inverter to said second variable gain amplifier at the same time, or the second reference voltage to said first and second variable gain amplifiers at the same time;
   gain control means for controlling a gain of at least one of said first and second variable gain amplifiers so that an output of said detection means becomes zero while the first reference voltage is supplied to said first variable gain amplifier, and the output of said inverter is applied to said second variable gain amplifier; and
   offset control means for controlling an offset of at least one of said first and said second variable gain amplifiers so that the output of said detection means becomes zero while said second reference voltage is applied to both said first and second variable gain amplifiers, and the output of said second variable gain amplifier which is inverted by said inversion means is applied to said adding means as the second input.

5. The vertical amplifier system for a multitrace oscilloscope as claimed in claim 4, wherein said inversion means is a transfer switch which is connected to the output of said second variable gain amplifier.

6. A calibration method for vertical amplifier system for a multitrace oscilloscope, the vertical amplifier system including a first variable gain amplifier and a second variable gain amplifier, said calibration method comprising the steps of:

applying a first reference voltage to said first and second variable gain amplifiers at the same time;

inverting a first output of said second variable gain amplifier, and outputting the inverted first output of said second variable gain amplifier;

adding a first output of said first variable gain amplifier to the inverted first output of said second variable gain amplifier, and outputting the added result;

adjusting a gain of at least one of said first and second variable gain amplifiers so that the added result becomes zero;

applying a second reference voltage to said first and second variable gain amplifiers at the same time;

inverting a second output of said second variable gain amplifier, and outputting the inverted second output of said second variable gain amplifier;

adding a second output of said first variable gain amplifier to the inverted second output of said second variable gain amplifier, and outputting the added result; and adjusting an offset of at least one of said first and second variable gain amplifiers so that the added result becomes zero.

7. The calibration method for vertical amplifier system for a multitrace oscilloscope as claimed in claim 6, further comprising the step of repeating the steps of adjusting a gain and adjusting an offset alternately.

8. The calibration method for vertical amplifier system for a multitrace oscilloscope as claimed in claim 6, wherein said second reference voltage is a ground voltage.

* * * * *